(12) United States Patent
Zhen

(10) Patent No.: US 8,132,322 B2
(45) Date of Patent: Mar. 13, 2012

(54) AUTOMATIC INSERTING METHOD, SYSTEM AND DEVICE FOR PCB BOARD

(75) Inventor: Xingwen Zhen, Shenzhen (CN)

(73) Assignee: Shenzhen Skyworth-RGB Electronic Co., Ltd., Shenzhen (CN)

( * ) Notice: Subject to any disclaimer, the term of this patent is extended or adjusted under 35 U.S.C. 154(b) by 538 days.

(21) Appl. No.: 12/357,172

(22) Filed: Jan. 21, 2009

(65) Prior Publication Data

US 2009/0193653 A1  Aug. 6, 2009

Related U.S. Application Data

(63) Continuation of application No. PCT/CN2008/000549, filed on Mar. 20, 2008.

(30) Foreign Application Priority Data

Dec. 7, 2007 (CN) .......................... 2007 1 0124914

(51) Int. Cl.
*H01R 43/00* (2006.01)
(52) U.S. Cl. ............ 29/854; 700/121; 29/755; 716/103; 716/137; 716/139; 345/419
(58) Field of Classification Search .................. 700/121; 29/854, 755; 716/103, 137, 139; 345/419
See application file for complete search history.

(56) References Cited

U.S. PATENT DOCUMENTS

| 4,731,923 A * | 3/1988 | Yagi et al. ........................ 29/833 |
| 4,906,987 A * | 3/1990 | Venaleck et al. ............... 361/778 |
| 5,508,938 A * | 4/1996 | Wheeler ........................ 716/112 |
| 2006/0117560 A1* | 6/2006 | Yamasaki et al. ............... 29/832 |
| 2006/0136786 A1* | 6/2006 | Nonaka et al. .................. 714/39 |

FOREIGN PATENT DOCUMENTS

| CN | 1708217 A | 12/2005 |
| CN | 1788534 A | 6/2006 |
| JP | 2005-136010 A | 5/2005 |
| JP | 2007-157948 A | 6/2007 |

OTHER PUBLICATIONS

Okuda, Tadamas, JP Publication No. 2005-353776, "Method for Optimizing Part Loading of Part Mounting Machine," English Translation, Juki Corp.*
International Search Report of PCT/CN2008/000549, dated Aug. 28, 2008.

* cited by examiner

*Primary Examiner* — Kakali Chaki
*Assistant Examiner* — Tejal Gami
(74) *Attorney, Agent, or Firm* — Hamre, Schumann, Mueller & Larson, P.C.

(57) ABSTRACT

The present invention relates to the electronic manufacturing field and provides an automatic inserting method, an inserting system and an inserting device for a PCB board The method includes: obtaining the insertion paths for insertion of components in the PCB, calling the optimization program to adjust the insertion parameters, generating the optimized insertion paths based on the insertion parameters adjusted, and carrying out the insertion based on the optimized insertion paths. In an embodiment of the present invention, the optimization programs are used to adjust the insertion parameters in the original insertion programs, generate the optimized insertion paths based on the parameters adjusted, and carry out the insertion as per the optimized insertion paths, which not only improves the insertion efficiency, but also avoids a waste of manpower and the improvement of insertion efficiency is inconspicuous in relation to man-made modification of insertion programs.

11 Claims, 6 Drawing Sheets

AUTOMATIC INSERTING METHOD, SYSTEM AND DEVICE FOR PCB BOARD

TECHNICAL FIELD

The present invention relates to the electronic manufacturing field, especially an automatic inserting method, an inserting system and an inserting device for a PCB board.

BACKGROUND

In general, the components which can be automatically inserted into the printed circuit board (PCB) are classified into three types, including jumper wires, axial lead parts and radial lead parts. During automatic insertion of components, it is necessary to adopt different inserting techniques for different components, for instance, JVK machines are used to insert jumper wires, AVK machines are used to insert axial lead parts, and RH machines or RHS machines are used to insert the radial lead parts. In the event that a number of components need to be installed on the printed circuit board, the number of installing paths approaches will be great. For these paths approaches, their execution efficiency is various. When a certain path approach is used for insertion, its speed may be faster than that of another path approach.

At present, the users have already adopted some approaches and numerical control programs to control the actual insertion process. However, due to the fact that in the practical manufacture, various components and points are needed, and the area of printed circuit board is great and the distribution of components is irregular (in terms of the coordinate and angles), etc, it is difficult or impossible for these man-made insertion programs to properly select an ideal paths owing to the effect of all kinds of parameters of machine, which will easily give rise to great alternation fluctuation in X and Y coordinates, feeder, insertion angle and insertion pitch in the program, and cause incessant phenomena of 'waiting for synchronization' in the machine. If the case is serious, it can be seen apparently that the machine will stop at times in the course of insertion, and thus leading to low insertion efficiency and a long insertion time.

For example, the inserting machines are used to insert the CRT TV printed circuit boards, with its AI production process data analysis as follows: the production data of a (404*257*1.6 mm) printed circuit board are described as follows: the number of the points of the total inserted jumper wires is 110 and the mean time of JVK machines for inserting the jumper wires is tested about 34 seconds per PCB, so it is about 0.31 seconds per point, the number of the points of the axial lead parts is 161, the number of the kinds of components is 61 and the mean time of AVK machines for inserting the axial lead parts is tested about 51 seconds per PCB, so it is about 0.317 seconds per point, the number of the points of the radial lead parts is 159 points, the number of the kinds of components is 48, and the mean time of RH machines for inserting the radial lead parts is tested about 77 seconds per PCB, so it is about 0.484 seconds per point. When comparing with the characteristic parameters of Panasert machine according to these data above-mentioned, we will find that the production process can not actually make the best use of the machines. Thereinafter we give a brief analysis of the four types of the machines.

(1) JVK machines for inserting jumper wires: the maximum theoretical speed of the machines is 0.13 seconds per element (the speed is limited on the strict conditions of the machine), without any limit on the polarity of components as long as the insertion is completed in the same direction at a time. For instance, insertion of all the elements of the angle of 0 degree (direction of X) is performed, and then insertion of all the elements of the angle of 90 degrees (direction of Y) is performed. The insertion speed is only dependent on the change in paths and insertion pitch selected by the programs. Generally, this is not taken into account by the man-made insertion programs, so a great change in the paths and the insertion pitches will slow down the insertion speed of the machines, without achieving the maximum theoretical speed basically. At present, for calculating a TV printed circuit board with 120 pieces of jumper wires in practical production, the speed shall be about 0.28 to 0.30 seconds per piece.

(2) AVK machines for inserting axial lead parts: on condition that the movement of feeder (Z axis) doesn't exceed three stations, the movement of both X and Y coordinates doesn't exceed 5 cm, the insertion pitch is unchanged and the data of the thickness of elements is unchanged, the maximum theoretical speed of the machines is 0.18 seconds per element for 0-degree angle, 0.15 seconds per element for 90-degree angle, 0.3 seconds per element for 180-degree angle and 0.27 seconds per element for 270-degree angle. However, at present it is difficult for the man-made programming methods to consider with these parameters, for actual insertion programs the coordinates X and Y, as well as Z axis for feeder, T axis for insertion pitch and large insertion angle will be subject to a great movement during insertion, which will markedly slow down the insertion speed. The actual average speed measured is 0.3 to 0.35 seconds per element.

(3) RH machines for inserting radial lead parts: it is also faced with the programming problems similar to AVK, and consideration shall be given to the movement of coordinates X and Y, and feeder (Z axis), as well as the change in height and insertion angle of component. Its maximum theoretical speed is 0.45 seconds per element. Inserting machine RHS: for insertion program, three factors as follows shall be considered, the first is movement paths of coordinates X and Y, the second is insertion angle, the third is height of component. Among them, the second and the third are the necessary parameters to the next insertion. Its maximum theoretical speed is 0.45 seconds per element.

On the whole, the existing insertion control programs can realize the task of insertion, but the existing insertion control programs only aim at the completion of insertion without considering the insertion efficiency. As a result, the insertion efficiency of existing insertion programs is very low. When the user wants to perfect the insertion efficiency, generally they will modify with the insertion control programs artificially. Such man-made modification is able to perfect some parameter data easily, but it neglects other parameter data. Therefore, the man-made modification not only needs a great deal of manpower, but also unable to improve the insertion efficiency markedly.

SUMMARY

A purpose of an embodiment of the present invention is to provide a method about automatic insertion of components into the printed circuit board, in order to solve the problem that the existing insertion control programs efficiency is low, and it will be a waste of manpower and the improvement of insertion efficiency is inconspicuous in relation to man-made modification of insertion programs.

The embodiment of the present invention of the method about automatic insertion of components into the printed circuit board can be realized and the method includes the following steps:

obtaining insertion paths for insertion of components in the printed circuit board;

calling optimization programs to adjust the insertion parameters;

generating the optimized inserting paths based on the insertion parameters adjusted;

carrying out the insertion based on the optimized insertion paths.

In addition, another purpose of the embodiment of the present invention is to provide a system for insertion of components into the printed circuit board. The system includes:

a path obtaining unit configured for obtaining the insertion paths for insertion of components in the printed circuit board;

an insertion parameter adjusting unit configured for adjusting the insertion parameters;

a calling module configured for calling the insertion parameter adjusting unit;

an insertion paths generating unit configured for generating the optimized insertion paths based on the insertion parameters adjusted;

an inserting unit configured for inserting based on the optimized insertion paths.

In addition, another purpose of the embodiment of the present invention is to provide a device for automatic insertion in the printed circuit board, it contains the system for automatic insertion in the printed circuit board, and the system includes:

a path obtaining unit configured for obtaining the insertion paths for insertion of components in the printed circuit board;

an insertion parameter adjusting unit used for adjusting the insertion parameters;

a calling module used for calling the insertion parameter adjustment unit;

an insertion paths generating unit, used for generating the optimized insertion paths based on the insertion parameters adjusted;

an inserting unit configured for inserting based on the optimized insertion paths.

In the embodiments of the present invention, the optimization programs are used to adjust the insertion parameters in the original insertion programs, generate the optimized insertion paths based on the parameters adjusted, and carry out the insertion based on the optimized insertion paths, which not only improves the insertion efficiency, but also avoids a waste of manpower and the improvement of insertion efficiency is inconspicuous in relation to man-made modification of insertion programs.

DETAILED DESCRIPTION OF THE PREFERRED EMBODIMENTS

In order to make the purpose, technical plan and advantages of the present invention to be clearer, with reference to the accompanying figures and embodiments, a further detailed description of the present invention is given. It should be appreciated, the specific embodiments described in the paper are only used for explaining the present invention, not configured for limiting the invention.

In the embodiments of the present invention, the optimization programs are used to adjust the insertion parameters in the original insertion programs, generate the optimized insertion paths based on the parameters adjusted, and carry out the insertion based on the optimized insertion paths, which not only improves the insertion efficiency, but also avoids a waste of manpower and the improvement of insertion efficiency is inconspicuous in relation to man-made modification of insertion programs.

Figure 1:
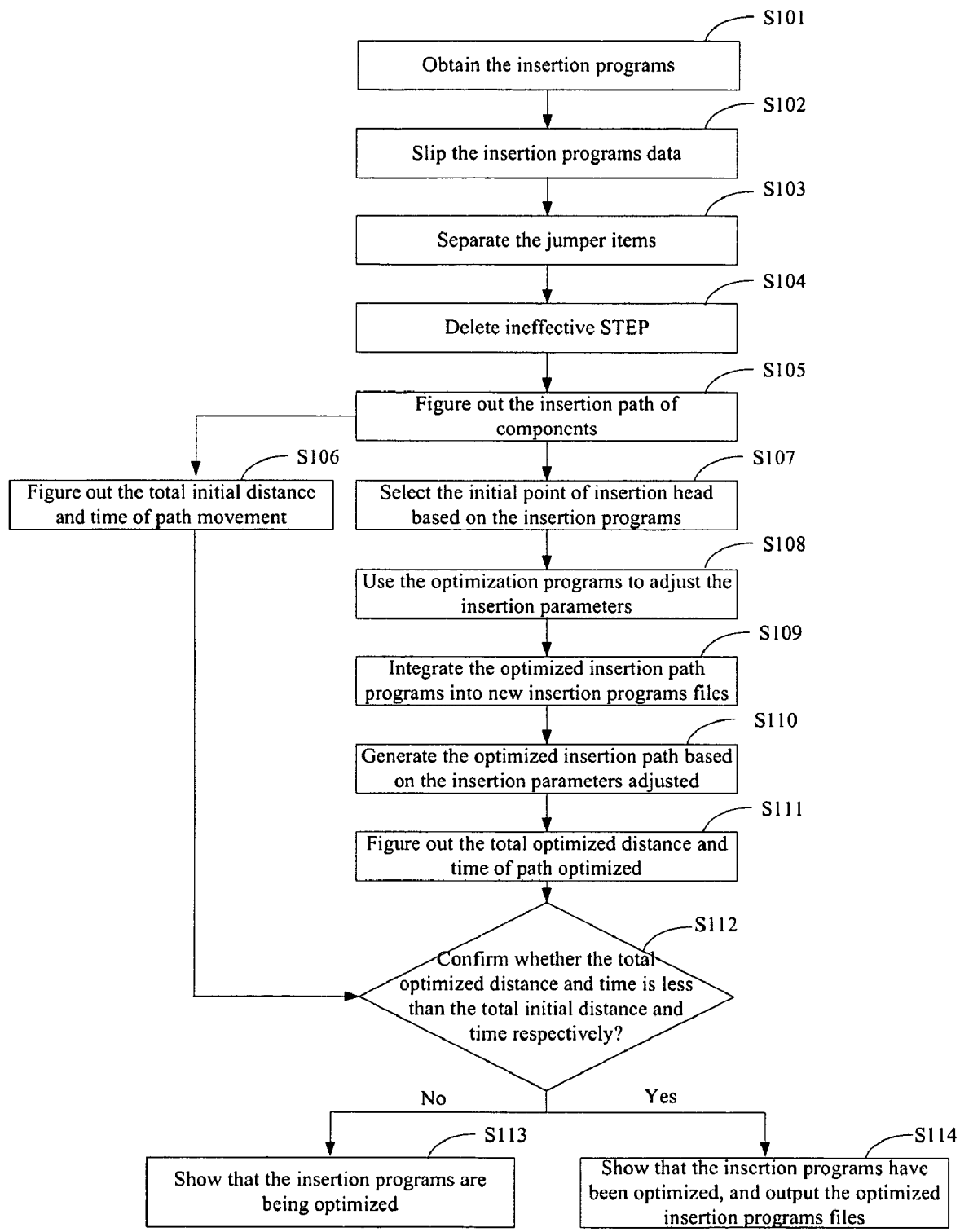
FIG. 1 is an implementation of flow diagram of an inserting method for insertion of components in the printed circuit board, in accordance with an embodiment of the present invention.

FIG. 1 shows the flow diagram of inserting methods for inserting components in the printed circuit board, in accordance with an embodiment of the present invention. The details are described as follows:

At step S101, the insertion program data is obtained. The insertion program data is saved in all kinds of insertion program files, such as the insertion program files postfixes with NCD, UDR and POD. The insertion program data can be obtained by reading these program files. Among them, the file with a postfix of NCD records the coordinates data of all the operation points while the file with a postfix of UDR records the type of machine relevant to the control data item (STEP) in the insertion programs, so the file with a postfix of UDR can be used to judge the type of machine familiar to the insertion programs. The file with a postfix of POD records the total deviation coordinate (OFFSET) of operation points.

At step S102, the insertion programs data is spitted to obtain the parameter data. The insertion program data is spitted into multiple STEP. On the basis of each STEP, the relevant parameter data is obtained, such as/value, value G, value M, value T, value X, value Y, value Z, value V, value W, as well as parameter items about descriptions of components.

At step S103, the jump items are separated. The insertion programs may contain jump items, in order to avoid giving an effect on the efficiency of insertion program when the jump items are carried out. In the embodiment of the present invention, the jump items are separated. The order mark/value of jump item is /7, so the jump items can be found out according to the parameter/value when the insertion programs are spitted into multiple STEP (control items). That is to say, the jump items can be separated by looking for the STEP with an order mark/value of /7 in all STEP.

At step S104, the ineffective STEP is deleted. The insertion programs may contain some ineffective STEP. In the embodiment of the present invention, the ineffective STEP shall be deleted. When value G of STEP is not equal to 0, the STEP is ineffective. So, when the insertion programs are spitted into multiple STEP, we can judge whether the STEP is ineffective based on value G, and then delete the entire ineffective STEP.

At step S105, the insertion paths of components is figured out according to the insertion programs of which the jump items have already been separated and the ineffective. STEP has been deleted.

The moving paths of insertion head is simulated according to the insertion programs of which the jump items have already been separated and the ineffective. STEP has been deleted. As an embodiment of the present invention, JVK machines are used for inserting the jumper wires, the AVK machines are used for inserting the axial lead parts, and the RH or RHS machines are used for inserting the radial lead parts (RHS machines are the upgrading version of RH machines, so only one of them is used for inserting the radial lead parts generally), so the insertion programs contains STEP relevant to the three kinds of automatic components. As a result, there are three moving paths accordingly.

At step S106, the total initial distance and time relevant to the paths movement are calculated. According to the moving paths of the insertion head of each inserting machine, the paths distance of the insertion head moving from the machine origin to each operation point then to the machine origin again can be calculated. Furthermore, the paths distance is also the initial paths distance of the machine. The initial paths distance divided by the theoretical average speed of the inserting machine is initial time of the machine. The sum total of the initial paths distances of the three machines is the total initial distance. The sum total of the initial time of the three machines is the total initial time.

At step S107, the start point of the insertion head is selected based on the insertion programs. As an embodiment of the present invention, it is feasible to adopt the middle points of both sides of insertion surface of PCB as the separation points, make two lines parallel with the two sides on the basis of the separation points, take the parallel lines as the separation lines which divide the insertion surface of PCB into four portions of a size, and take the portion at the top left corner as the first quadrant. The insertion point, which is the farthest from the machine origin in linear distance, is used as the start point. The start point is also the origin of program.

At step S108, the optimization programs are called to adjust the insertion parameters. As an embodiment of the present invention, the optimization programs include JVK optimization program, AVK optimization program, RH optimization program as well as partial or all RHS optimization program. The file with a postfix of UDR has recorded the type of machine relevant to STEP in the insertion program, so the file is able to be used to identify the type of machine so as to select corresponding optimization program to optimize the paths of the machine. When the type of machine is identified, the type of components is also gained accordingly, that is to say, the corresponding optimization program can be selected.

At step S109, the insertion program optimized is integrated into new insertion program files. In order to save the optimized paths, the insertion program optimized is integrated into new insertion program file, so that the optimized paths can be obtained by reading the file when it is time for next insertion. The new insertion program files are still three kinds of files with a postfix of NCD, UDR and POD respectively.

At step S110, the moving paths of the optimized insertion head are obtained based on the new insertion programs.

At step S111, the total optimized distance and time of the optimized paths are calculated. According to new moving paths of each inserting machine, the paths distance of the insertion head moving from the program origin to each operation point then to the program origin again can be calculated. That is to say, the optimized paths distance of the machine is obtained. The optimized paths distance divided by the theoretical average speed of the inserting machine is the optimized time of the machine. The sum total of the optimized paths distances of the three machines is the total optimized distance. The sum total of the optimized time of the three machines is the total optimized time.

At step S112, it is to judge whether the total optimized distance and total optimized time is less than the total initial distance and total initial time respectively. The theoretical average speed of machine is still a constant before or after optimization of the insertion programs, so it is enough to compare the size of the total distance before and after optimization.

At step S113, it shows the message that the insertion programs are being optimized. When the total distance and time before and after optimization is unchanged, some insertion programs may have been optimized but the operator doesn't know it, and send an optimization order again. At this time, it shows that the original programs are being optimized, without changing the original insertion program file.

At step S114, there is message showing that the insertion programs have already been optimized, and the optimized insertion program files are outputted. When the total optimization distance and time is less than the total initial distance and time respectively, the message showing that the insertion programs have already been optimized is outputted. Furthermore, the NCD, UDR and POD insertion program files are output.

At step S115, it is to carry out the insertion based on the insertion paths optimized.

Figure 2:
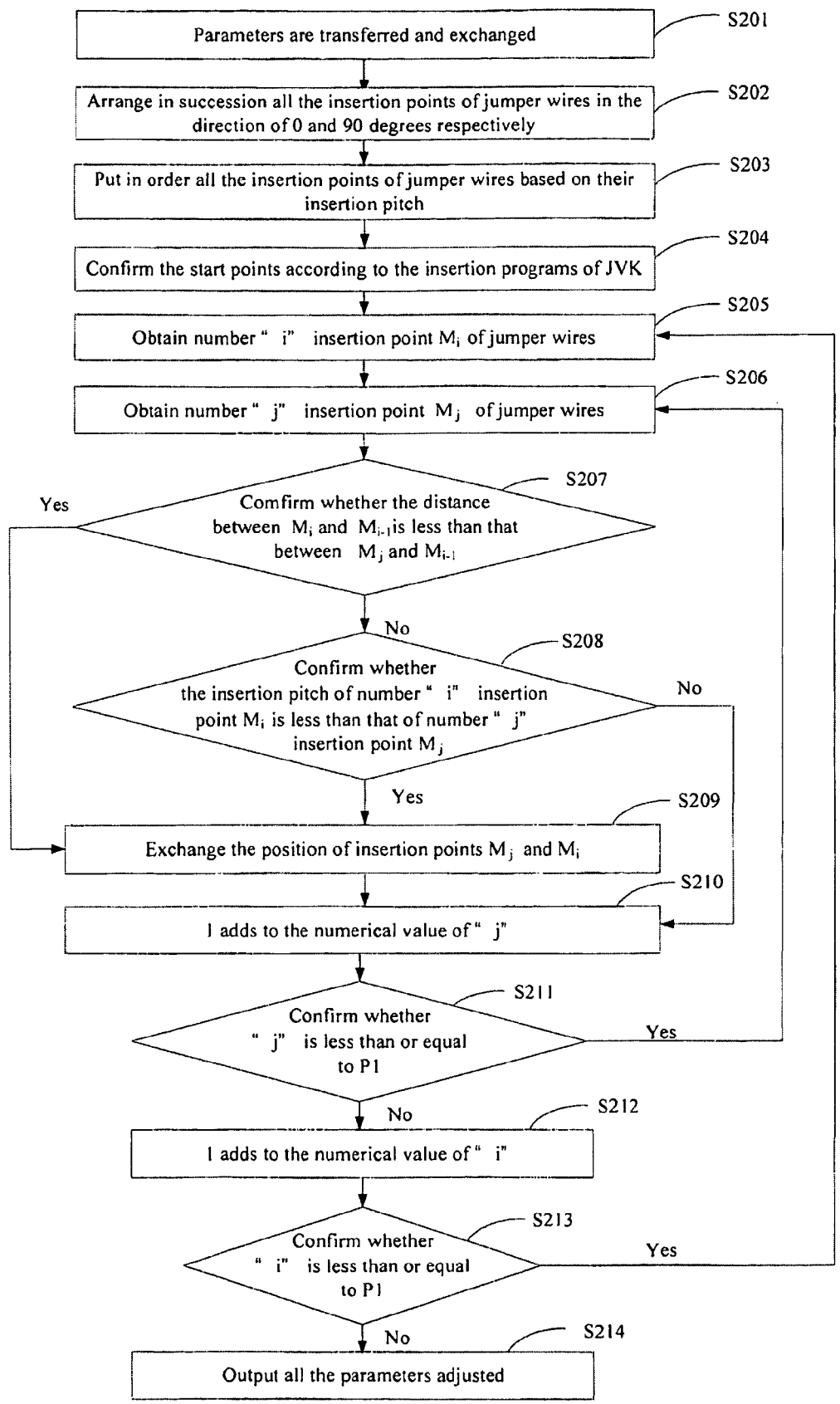
FIG. 2 is an implementation of flow diagram for adjustment of the insertion parameters of insertion programs of JVK machines, in accordance with an embodiment of the present invention.

FIG. 2 is the flow diagram for adjusting of the insertion parameters of insertion programs of JVK machines, in accordance with an embodiment of the present invention. The detailed descriptions are as follows:

At step S201, the parameters are transferred and exchanged. All of the parameter values in the main insertion program are obtained, such as the values of coordinates, and insertion pitches etc.

At step S202, arrange in succession all the insertion points of jumper wires in the direction of 0 and 90 degrees respectively relevant to the insertion paths of jumper wires. When JVK machines are used for inserting the jumper wires, only 0 and 90 degrees (X and Y direction) are suitable for printed circuit boards. Take all the insertion points of jumper wires in the direction of 0 degree as a group, and take all the insertion points of jumper wires in the direction of 90 degrees as another group. Arrange the two groups of insertion points in succession. Therefore, when JVK machine is inserting the jumper wires, all the insertion points of jumper wires in the direction of 0 (or 90) degree (s) can be used for insertion. Then, JVK machine inserts the rest of insertion points of jumper wires in the direction of 90 (or 0) degrees, without having the insertion head of machine switched frequently in the direction of 0 or 90 degrees, and thus saving the time.

At step S203, the insertion pitches of all the insertion points of jumper wires are calculated, and all the insertion points of jumper wires are put in order based on the size of insertion pitches.

The insertion points are put in order (from large to small or from small to large) based on the size of insertion pitches of all the insertion points of jumper wires. As an embodiment of the present invention, it is feasible to divide all of the insertion points into multiple groups. In this way, during insertion, the change range of insertion pitch of latter insertion points is generally less than that of former insertion points, which can reduce the time for insertion pitch of machine.

At step S204, the start points are confirmed based on the insertion programs of JVK. As an embodiment of the present invention, the point, which is the farthest from the machine origin, can be used as the start point.

At step S205, number "i" insertion point $M_i$ of jumper wires is obtained. "i" is a variable parameter, which can be any integral number ranging from 2 to P1, including 2 and P1. Among them, P1 is the number of all STEP in the insertion programs of JVK.

At step S206, number "j" insertion point $M_j$ of jumper wires is obtained. "j" is a variable parameter, which can be any integral number ranging from "i+1" to P1, including "i+1" and "P1". Furthermore, its initial value is "i+1".

At step S207, it is to judge whether the distance between number "i" insertion point $M_i$ and number "i−1" insertion point $M_{i-1}$ is less than that between number "j" insertion point $M_j$ and number "i−1" insertion point $M_{i-1}$. If the distance between $M_i$ and $M_{i-1}$ is less than that between $M_j$ and $M_{i-1}$, carry out step S209.

At step S208, it is to judge whether the insertion pitch of number "i" insertion point is less than that of number "j" insertion point. When the distance between number "i" insertion point and number "i−1" insertion point is not less than that between number "j" insertion point and number "i−1" insertion point, judge whether the insertion pitch of number "i" insertion point is less than that of number "j" insertion point. When the insertion pitch of number "i" insertion point is less than that of number "j" insertion point, carry out step S210.

At step S209, it is to exchange the position between insertion point $M_j$ and insertion point $M_i$. That is to exchange the order of the two insertion points, namely the insertion order of the two insertion points.

At step S210, 1 adds to the numerical value of "j". When the insertion pitch of number "i" insertion point is more than or equal to that of number "j" insertion point, 1 adds to the numerical value of "j".

At step S211, judge whether "j" is less than or equal to P1. After 1 adds to the numerical value of "j", judge whether "j" is less than or equal to P1. If so, return to step S206.

At step S212, 1 adds to the numerical value of "i". After 1 adds to the numerical value of "j", if "j" is more than P1, 1 adds to the numerical value of "i".

At step S213, after 1 adds to the numerical value of "i", judge whether "i" is less than P1. If so, return to step S205.

At step S214, it is to output all the parameters adjusted. After 1 adds to the numerical value of "i", if "i" is not less than "P1", it suggests that the precedence ordering is completed. All the parameters adjusted are outputted.

Among the above-mentioned steps, steps S205 to S211, in fact, are to reorder all the insertion points of jumper wires so that the distance between each insertion point and its former insertion point is not more than that between latter any insertion point and its former insertion point. Furthermore, the difference of insertion pitches between the two adjacent insertion points of jumper wires increases, which can optimize the insertion paths of jumper wires relevant to the insertion programs after adjustment of insertion parameters.

Figure 3:
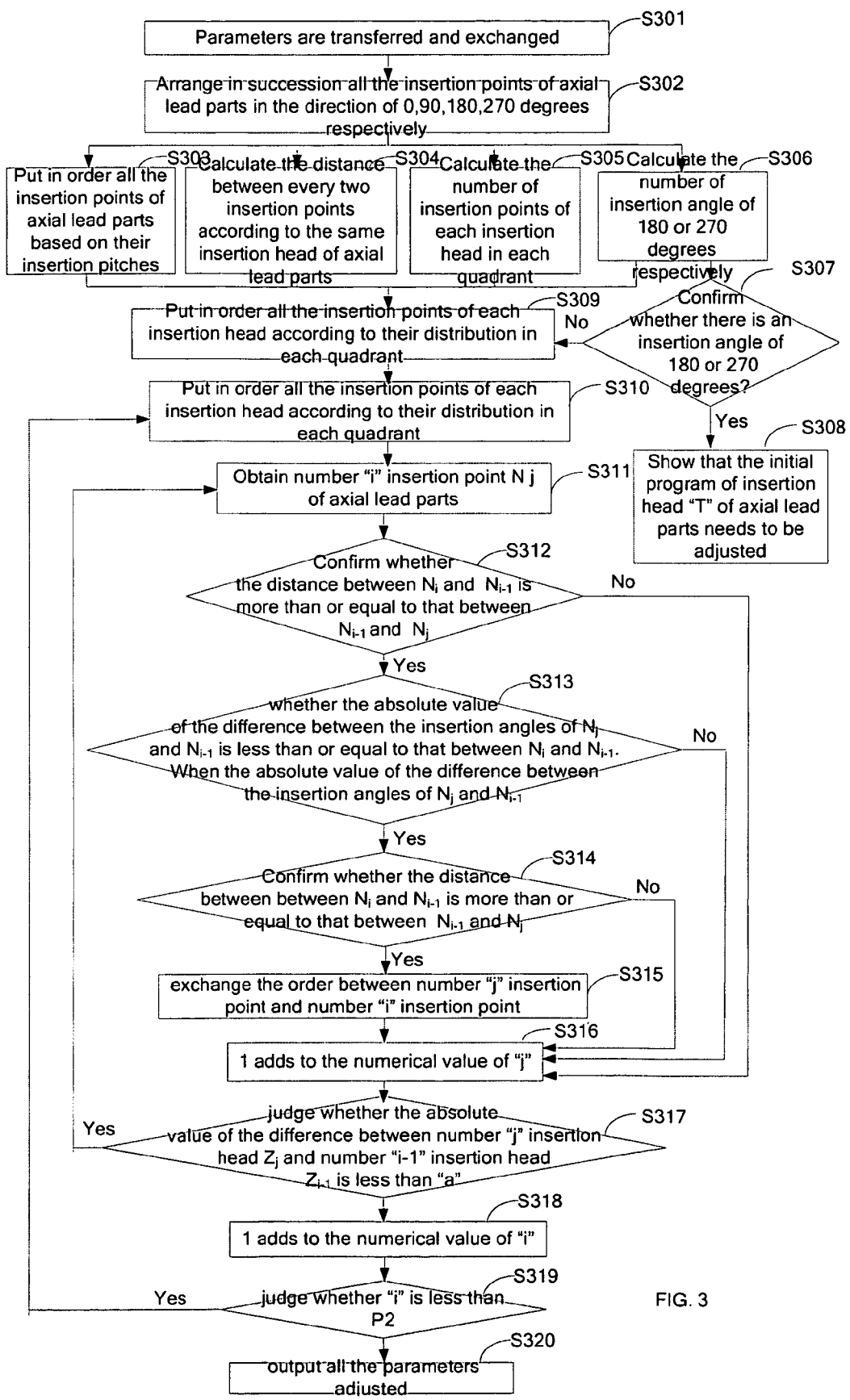
FIG. 3 is an implementation of flow diagram for adjustment of the insertion parameters of insertion programs of AVK machines, in accordance with an embodiment of the present invention.

FIG. 3 is an implementation of flow diagram for adjustment of the insertion parameters of insertion programs of AVK machines, in accordance with an embodiment of the present invention. The detailed descriptions are as follows:

At step S301, the parameters are transferred and exchanged. All of the parameter values in the main insertion programs are obtained, such as values of coordinates and insertion pitches etc.

At step S302, arrange in succession all the insertion points of axial lead parts in the direction of 0, 90, 180 and 270 degrees respectively relevant to the insertion path of axial lead parts. When AVK machines are used for inserting the axial lead parts, some consideration shall be given to the polarity of components. That is to say, when AVK machines are used for inserting the axial lead parts, angles of 0, 90, 180 and 270 degrees are suitable for operation. In order to avoid that the insertion head of machine is switched frequently between the four directions, it is necessary to take all the insertion points of axial lead parts in the same direction as a group respectively, namely that each direction is corresponding to a group, so that AVK machines can insert the axial lead parts one group after another. That is to say, the axial lead parts in the next direction are inserted after all the axial lead parts in a direction are inserted, which doesn't have to have the insertion head of machine switched frequently between the four directions, and thus saving the time.

At step S303, the insertion pitches of all the insertion points of axial lead parts are calculated, and all the insertion points of axial lead parts are put in order based on the size of insertion pitches.

The insertion points are put in order (from large to small or from small to large) based on the size of insertion pitches of all the insertion points of axial lead parts. As an embodiment of the present invention, it is feasible to divide all of the insertion points into multiple groups. In this way, during insertion, the change range of insertion pitch of latter insertion points is generally less than that of former insertion points, which can reduce the time for insertion pitch of machine.

At step S304, the distance between every two insertion points is calculated based on the same insertion head of axial lead parts. The inserting machine JVK only has an insertion head, but the inserting machine AVK needs to insert resistance, and diode etc, so it has multiple insertion heads.

At step S305, it is to divide PCB into multiple quadrants, and calculate the number of insertion points of insertion head of each axial lead part in each quadrant, namely, confirm the area of insertion points of all axial lead parts relevant to the insertion head of each axial lead part. For example, PCB is divided into four quadrants as described at step S107. Of course, it is feasible to divide the four quadrants further.

At step S306, it is to count the number of insertion angles 0 degree and 180 degrees in the X direction, 90 degrees and 270 degrees in the Y direction respectively.

At step S307, it is to judge whether there is an insertion angle of 180 degrees or 270 degrees. If not, carry out step S309 directly.

At step S308, it shows the message that the original programs of the insertion head of direction "T" of axial lead parts need to be adjusted. When there is an insertion angle of 180 degrees or 270 degrees, the message shows up. Therefore, the user can modify the original program by hand as required.

At step S309, put all the insertion points in order according to the distribution of insertion points relevant to the insertion head of each axial lead part in each quadrant. As an embodiment of the present invention, it is feasible to mark the insertion head of each axial lead part according to the distribution of insertion points relevant to the insertion head of each axial lead part in each quadrant. The marking methods are as follows: marking the insertion head with 'insertion head Z1 in section 1' if all the insertion points relevant to the insertion head of axial lead parts are distributed in the first quadrant; marking the insertion head with 'insertion head Z2 in section 2' if all the insertion points relevant to the insertion head of axial lead parts are distributed in the second quadrant; marking the insertion heads with 'insertion head Z3 in section 3' and 'insertion head Z4 in section 4' by analogy if their insertion points are distributed in a certain quadrant; marking the insertion head with 'Z1-2' if the insertion points are distributed in the first and second quadrants; marking the insertion heads with Z1-3, Z1-4, Z2-3, Z2-4 and Z3-4 by analogy for the rest of insertion points distributed in two quadrants; marking the insertion head with Z1-2-3 if the insertion points are in the first, second and third quadrants; marking the insertion heads with Z1-2-4, Z1-3-4 and Z2-3-4 for the rest of insertion points distributed in three quadrants; marking the insertion head with Z1-2-3-4 if the insertion points are in the first, second, third and fourth quadrants.

Then, put all the insertion points in order according to the marks of insertion heads of axial lead parts. As an embodiment of the present invention, the area sequence for insertion of radial lead parts is from the first quadrant to the fourth quadrant successively, so the precedence ordering of insertion points is as follow: all the insertion points relevant to insertion heads Z1 and Z12 in section 1, and all the insertion points respectively relevant to insertion heads Z2 and Z2-3 in section 2, insertion heads Z3 and Z3-4 in section 3, insertion heads Z4, Z1-4, Z1-3-4, Z1-3, Z1-2-3-4, Z2-3-4, Z2-4, Z1-2-3 and Z1-2-4 in section 4.

At step S310, it is to obtain number "i" insertion point $N_1$ of axial lead parts. "i" is a variable parameter, which can be any integral number ranging from 2 to P2, including 2 and P2 while the initial value of "i" is 2. Among them, P2 is the number of all STEP in the insertion programs of AVK.

At step S311, it is to obtain number "j" insertion point $N_j$ of axial lead parts. "j" is a variable parameter, which can be any integral number ranging from "i+1" to P2, including "i+1" and P2. And the initial value of "j" is "i+1".

At step S312, it is to judge whether the distance between number "i" insertion point $N_i$ and number "i-1" insertion point $N_{i-1}$ is more than or equal to that between number "i-1" insertion point $N_{i-1}$ and number "j" insertion point $N_j$. If the distance between $N_j$ and $N_{i-1}$ is more than that between $N_i$ and $N_{i-1}$, carry out step S316.

At step S313, it is to judge whether the absolute value of the difference between the insertion angle of number "j" insertion point and the insertion angle of number "i-1" insertion point is less than or equal to that between number "i" insertion point and number "i-1" insertion point.

When the distance between $N_j$ and $N_{j-1}$ is less than or equal to that between $N_i$ and $N_{i-1}$, judge whether the absolute value of the difference between the insertion angles of $N_j$ and $N_{i-1}$ is less than or equal to that between $N_i$ and $N_{i-1}$. When the absolute value of the difference between the insertion angles of $N_j$ and $N_{i-1}$ is more than that between $N_i$ and $N_{i-1}$, carry out step S316.

At step S314, it is to judge whether the absolute value of the difference between the insertion pitch of number "j" insertion point and the insertion pitch of number "i-1" insertion point is less than or equal to that between number "i" insertion point and number "i-1" insertion point. When the absolute value of the difference between the insertion angles of $N_j$ and $N_{i-1}$ is less than or equal to that between $N_i$ and $N_{i-1}$, judge whether the absolute value of the difference between the insertion pitches of $N_j$ and $N_{i-1}$ is less than or equal to that between $N_i$ and $N_{i-1}$. If the absolute value of the difference between the insertion pitches of $N_j$ and $N_{i-1}$ is more than that between $N_i$ and $N_{i-1}$, carry out step S316.

At step S315, it is to exchange the order between number "j" insertion point and number "i" insertion point.

At step S316, 1 adds to the numerical value of "j".

At step S317, it is to judge whether the absolute value of the difference between number "j" insertion head $Z_j$ and number "i-1" insertion head $Z_{i-1}$ is less than "a" which is a positive integer. Adjust the size of "a" as required. Furthermore, 3 is a good value for "a". When the absolute value of the difference between $Z_j$ and $Z_{i-1}$ is less than or equal to "a", return to step S311.

At step S318, 1 adds to the numerical value of "i". When the absolute value of the difference between $Z_j$ and $Z_{i-1}$ is more than "a", let 1 add to the numerical value of "i".

At step S319, it is to judge whether "i" is less than P2. If so, return to step S310.

At step S320, it is to output all the parameters adjusted. After 1 adds to the numerical value of "i", if "i" is not less than P2, it shows that the precedence ordering is completed, and it is time for sending out all the parameters adjusted.

Among the above-mentioned steps, steps S301 to S319, in fact, are to reorder all the insertion points of axial lead parts so that the distance between each insertion point of axial lead parts and its former insertion point is not more than that between latter any insertion point and its former insertion point. Furthermore, the absolute value of the difference of insertion angles between the insertion point and its former insertion point is less than that between latter any insertion point and its former insertion point. The absolute value of the difference of insertion pitches between the insertion point and its former insertion point is less than that between latter any insertion point and its former insertion point. Therefore, it is successful to optimize the insertion paths of axial lead parts relevant to the insertion programs after adjustment of insertion parameters.

Figure 4:
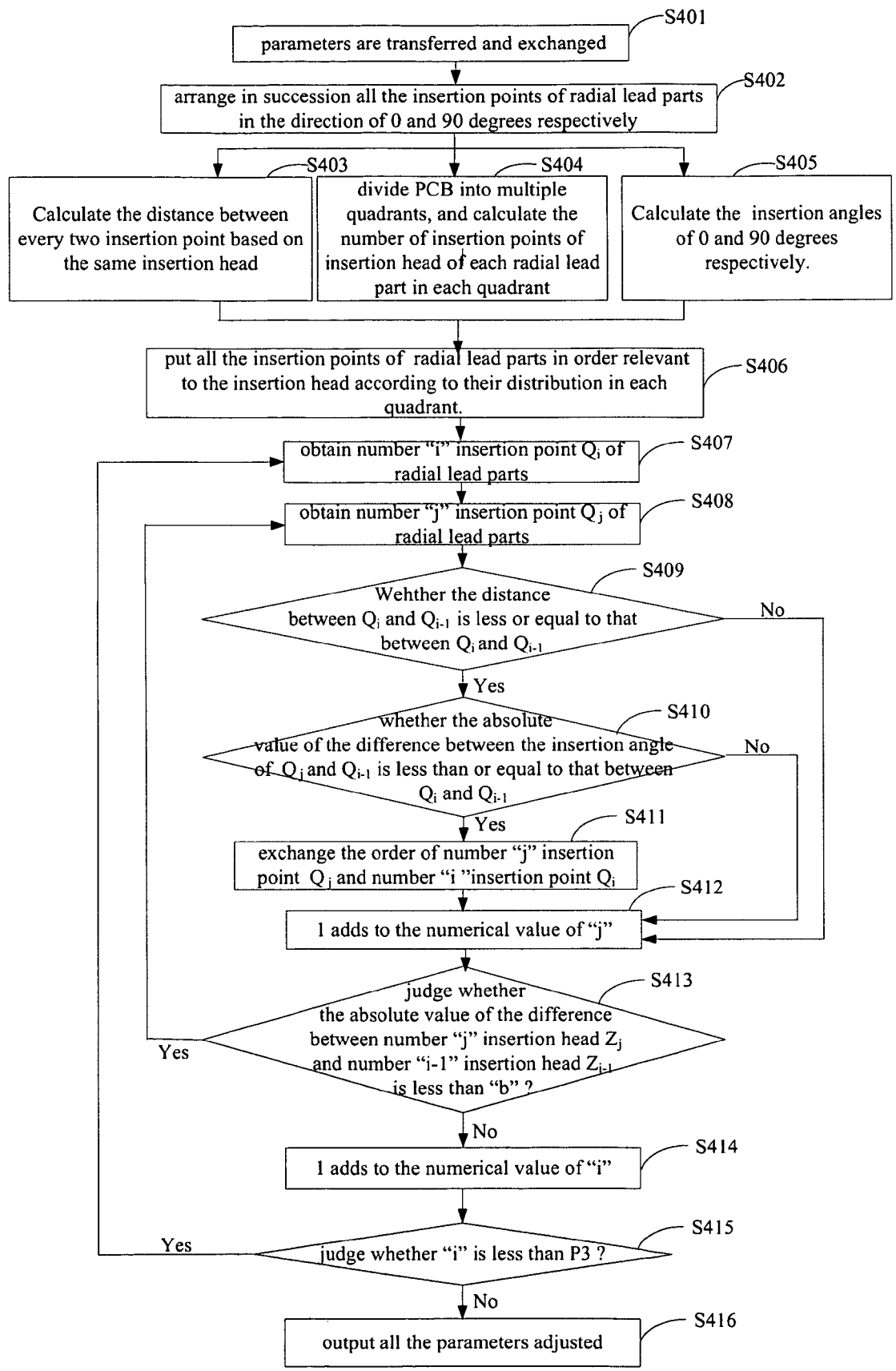
FIG. 4 is an implementation of flow diagram for adjustment of the insertion parameters of insertion programs of RH machines, in accordance with an embodiment of the present invention.

FIG. 4 is an implementation of flow diagram for adjustment of the insertion parameters of insertion programs of RH machine, in accordance with an embodiment of the present invention. The detailed descriptions are as follows:

At step S401, the parameters are transferred and exchanged. All of the parameter values in the main insertion programs are obtained, such as values of coordinates and insertion pitch etc.

At step S402, arrange in succession all the insertion points of radial lead parts in the direction of 0 and 90 degrees respectively relevant to the insertion paths of radial lead parts. When RH machines are used for inserting the radial lead parts, only 0 and 90 degrees are suitable. Take all the insertion points of radial lead parts in the direction of 0 degree as a group, and take all the insertion points of radial lead parts in the direction of 90 degrees as another group, so as to avoid that the insertion head of machine is switched frequently in the two directions. Arrange the two groups of insertion points in succession, so that, when RH machine is inserting the radial lead parts, all the insertion points of radial lead parts in the direction of 0 (or 90) degree (s) can be used for insertion. Then, RH machine inserts the rest of insertion points of radial lead parts in the direction of 90 (or 0) degrees, without having the insertion head of machine switched frequently in the direction of 0 or 90 degrees, and thus saving the time.

At step S403, the distance between every two insertion points is calculated based on the same insertion head of radial lead parts.

At step S404, PCB is divided into multiple quadrants, and calculate the number of insertion points of insertion head of each radial lead part in each quadrant, namely, confirm the area of insertion points of all radial lead parts relevant to the insertion head of each radial lead part.

At step S405, it is to count the number of insertion angles of 0 degree in the X direction and 90 degrees in the Y direction respectively.

At step S406, it is to put all the insertion points in order according to the distribution of insertion points relevant to the insertion head of each radial lead part in each quadrant. As an embodiment of the present invention, it is feasible to mark the insertion head of each radial lead part according to the distribution of insertion points relevant to the insertion head of each radial lead part in each quadrant. The marking methods are as follows: marking the insertion head with 'insertion head Z1 in section 1' if all the insertion points relevant to the insertion head of radial lead parts are distributed in the first quadrant; marking the insertion head with 'insertion head Z2 in section 2' if all the insertion points relevant to the insertion head of radial lead parts are distributed in the second quadrant; marking the insertion heads with 'insertion head Z3 in section 3' and 'insertion head Z4 in section 4' by analogy if their insertion points are distributed in a certain quadrant; marking the insertion head with 'Z1-2' if the insertion points are distributed in the first and second quadrants; marking the insertion heads with Z1-3, Z1-4, Z2-3, Z2-4 and Z3-4 by analogy for the rest of insertion points distributed in two quadrants; marking the insertion head with Z1-2-3 if the insertion points are in the first, second and third quadrants; marking the insertion heads with Z1-2-4, Z1-3-4 and Z2-3-4 for the rest of insertion points distributed in three quadrants, marking the insertion head with Z1-2-3-4 if the insertion points are in the first, second, third and fourth quadrants.

Then, put all the insertion points in order according to the marks of insertion heads of radial lead parts. As an embodiment of the present invention, the area sequence for insertion of radial lead parts is from the first quadrant to the fourth quadrant successively, so the precedence ordering of insertion points is as follow: all the insertion points relevant to insertion heads Z1 and Z12 in section 1, and all the insertion points respectively relevant to insertion heads Z2 and Z2-3 in section 2, insertion heads Z3 and Z3-4 in section 3, and insertion heads Z4, Z1-4, Z1-3-4, Z1-3, Z1-2-3-4, Z2-3-4, Z2-4, Z1-2-3 and Z1-2-4 in section 4.

At step S407, it is to obtain number "i" insertion point $Q_i$ of radial lead parts. "i" is a variable parameter, which can be any integral number ranging from 2 to P3, including 2 and P3. Among them, P3 is the number of all STEP in the insertion programs of RH.

At step S408, it is to obtain number "j" insertion point $Q_j$ of radial lead parts. "j" is a variable parameter, which can be any integral number ranging from "i+1" to P3, including "i+1" and P3. And the initial value of "j" is "i+1".

At step S409, it is to judge whether the distance between number "i" insertion point $Q_i$ and number "i−1" insertion point $Q_{i-1}$ is more than or equal to that between number "i−1" insertion point $Q_{i-1}$ and number "j" insertion point $Q_j$. If the distance between $Q_i$ and $Q_{i-1}$ is more than that between $Q_j$ and $Q_{i-1}$, carry out step S412.

At step S410, it is to judge whether the absolute value of the difference between the insertion angle of number "j" insertion point and the insertion angle of number "i−1" insertion point is less than or equal to that between number "i" insertion point and number "i−1" insertion point. When the distance between $Q_j$ and $Q_{i-1}$ is less than or equal to that between $Q_i$ and $Q_{i-1}$, judge whether the absolute value of the difference between the insertion angles of $Q_j$ and $Q_{i-1}$ is less than that between $Q_i$ and $Q_{i-1}$. When the absolute value of the difference between the insertion angles of $Q_j$ and $Q_{i-1}$ is more than that between $Q_i$ and $Q_{i-1}$, carry out step S412.

At step S411, it is to exchange the order between number "j" insertion point and number "i" insertion point. When the distance between $Q_j$ and $Q_{i-1}$ is less than or equal to that between $Q_i$ and $Q_{i-1}$, and the absolute value of the difference between the insertion angles of $Q_j$ and $Q_{i-1}$ is less than or equal to that between $Q_i$ and $Q_{i-1}$, exchange the position between number "j" insertion point and number "i" insertion point.

At step S412, 1 adds to the numerical value of "j".

At step S413, it is to judge whether the absolute value of the difference between number "j" insertion head $Z_j$ and number "i−1" insertion head $Z_{i-1}$ is less than "b" which is a positive integer. Adjust the size of "b" as required. Furthermore, 2 is a good value for "b". When the absolute value of the difference between $Z_j$ and $Z_{i-1}$ is less than or equal to "b", return to step S408.

At step S414, 1 adds to the numerical value of "i". When the absolute value of the difference between $Z_j$ and $Z_{i-1}$ is more than "b", let 1 add to the numerical value of "i".

At step S415, it is to judge whether "i" is less than P3. If so, return to step S407.

At step S416, it is to output all the parameters adjusted. After 1 adds to the numerical value of "i", if "i" is not less than P3, it shows that the precedence ordering is completed, and it is time for sending out all the parameters adjusted.

Among the above-mentioned steps, steps S407 to S415, in fact, are to reorder all the insertion points of radial lead parts so that the distance between each insertion point of radial lead parts and its former insertion point is less than that between latter any insertion point and its former insertion point. Furthermore, the absolute value of the difference of insertion angles between the insertion point and its former insertion point is less than that between latter any insertion point and its former insertion point. Therefore, it is successful to optimize the insertion paths of radial lead parts relevant to the insertion programs after adjustment of insertion parameters.

Figure 5:
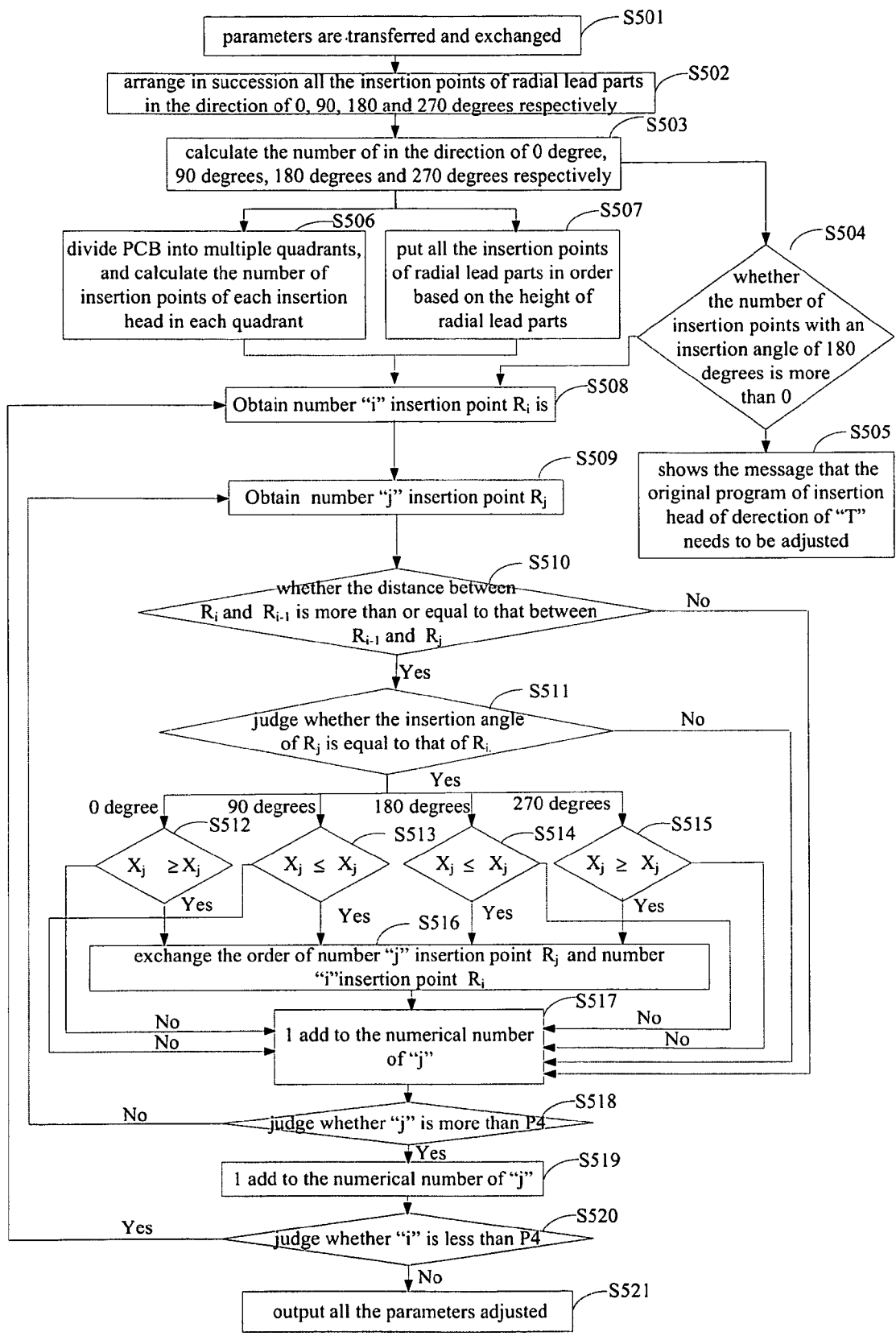
FIG. 5 is an implementation of flow diagram for adjustment of the insertion parameters of insertion programs of RHS machines, in accordance with an embodiment of the present invention.

FIG. 5 is an implementation of flow diagram for adjustment of the insertion parameters of insertion programs of RHS machine, in accordance with an embodiment of the present invention. RHS machine is the upgrading version of RH machine, so only one of them is used for inserting the radial lead parts generally. If RHS is used for inserting the radial lead parts, the detailed flow is as follows:

At step S501, the parameters are transferred and exchanged. All of the parameter values in the main insertion program are obtained, such as the values of coordinates, and insertion pitch etc.

At step S502, arrange in succession all the insertion points of radial lead parts in the direction of 0, 90, 180 and 270 degrees respectively relevant to the insertion paths of axial lead parts. When RHS machines are used for inserting the radial lead parts, some consideration shall be given to the polarity of components. That is to say, when RHS machines are used for inserting the radial lead parts, angles of 0, 90, 180 and 270 degrees are suitable for operation. In order to avoid that the insertion head of machine is switched frequently between the four directions, it is necessary to take all the insertion points of radial lead parts in the same angle as a group respectively, namely that each angle is corresponding to a group, so that RHS machines can insert the radial lead parts one group after another. That is to say, the radial lead parts in the next angle are inserted after all the radial lead parts in a angle are inserted, which doesn't have to have the insertion head of machine switched frequently between the four directions, and thus saving the time.

At step S503, the insertion angles in the direction of X and Y are counted respectively. That is to say, the insertion angles in the direction of 0 degree, 90 degrees, 180 degrees and 270 degrees are counted.

At step S504, it is to judge whether the number of insertion points with an insertion angle of 180 degrees is more than 0. If not, carry out step S508.

At step S505, it shows the message that the original program of insertion head of direction of "T" needs to be adjusted.

At step S506, PCB is divided into multiple quadrants, and the number of insertion points of each insertion head in each quadrant is calculated.

At step S507, it is to put all the insertion points of radial lead parts in order based on the height of radial lead parts which the insertion points need.

At step S508, number "i" insertion point $R_i$ is obtained. "i" is a variable parameter, which can be any integral number ranging from 2 to P4, including 2 and P4. Furthermore, its initial value is 2. Among them, P4 is the number of all STEP in the insertion programs of RHS. The insertion angle of $R_i$ is $T_i$.

At step S509, number "j" insertion point $R_j$ is obtained. "j" is a variable parameter, which can be any integral number ranging from "i+1" to P4, including "i+1" and P4. Furthermore, its initial value is "i+1". The insertion angle of $R_j$ is $T_j$.

At step S510, it is to judge whether the distance between number "i" insertion point $R_i$ and number "i−1" insertion point $R_{i-1}$ is more than or equal to that between number "i−1" insertion point $R_{i-1}$ and number "j" insertion point $R_j$. When the distance between $R_i$ and $R_{i-1}$ is less than that between number "i−1" insertion point $R_i$, and number "j" insertion point $R_j$, carry out step S517.

At step S511, it is to judge whether the insertion angle of $R_j$ is equal to that of $R_i$. When the distance between $R_i$ and $R_{i-1}$ is less than that between number "i−1" insertion point $R_{i-1}$ and number "j" insertion point $R_j$, judge whether the insertion angle of $R_j$ is equal to that of $R_i$. If not, carry out step S517.

At step S512, when $T_j$ is 0 degree, judge whether $X_j$ is more than or equal to $X_i$. When $X_j$ is more than or equal to $X_1$, carry out step S516. Otherwise, carry out step S517.

At step S513, when $T_j$ is 90 degrees, judge whether $X_j$ is less than or equal to $X_i$. When $X_j$ is less than or equal to $X_i$, carry out step S516. Otherwise, carry out step S517.

At step S514, when $T_j$ is 180 degrees, judge whether $X_j$ is more than or equal to $X_i$. When $X_j$ is more than or equal to $X_i$, carry out step S516. Otherwise, carry out step S517.

At step S515, when $T_j$ is 270 degrees, judge whether $X_j$ is less than or equal to $X_i$. When $X_j$ is less than or equal to $X_i$, carry out step S516. Otherwise, carry out step S517.

At step S516, it is to exchange the order of number "j" insertion point and number "" insertion point.

At step S517, let 1 add to "j".

At step S518, judge whether "j" is more than P4. If not, return to step S509.

At step S519, let 1 add to "i".

At step S520, after 1 adds to "i", judge whether "i" is less than P4. If so, return to step S508.

At step S521, output all the parameters adjusted. After 1 adds to "i", if "i" is not less than P4, it shows that the precedence ordering is completed, and it is time for sending out all the parameters adjusted.

Among the above-mentioned steps, steps S508 to S520, in fact, are to reorder all the insertion points of radial lead parts so that the distance between each insertion point of radial lead parts and its former insertion point is less than that between latter any insertion point and its former insertion point. Furthermore, the insertion angle of the insertion point of radial lead parts is not equal to that of any insertion point. Therefore, it is successful to optimize the insertion paths of radial lead parts relevant to the insertion programs after adjustment of insertion parameters.

Figure 6:
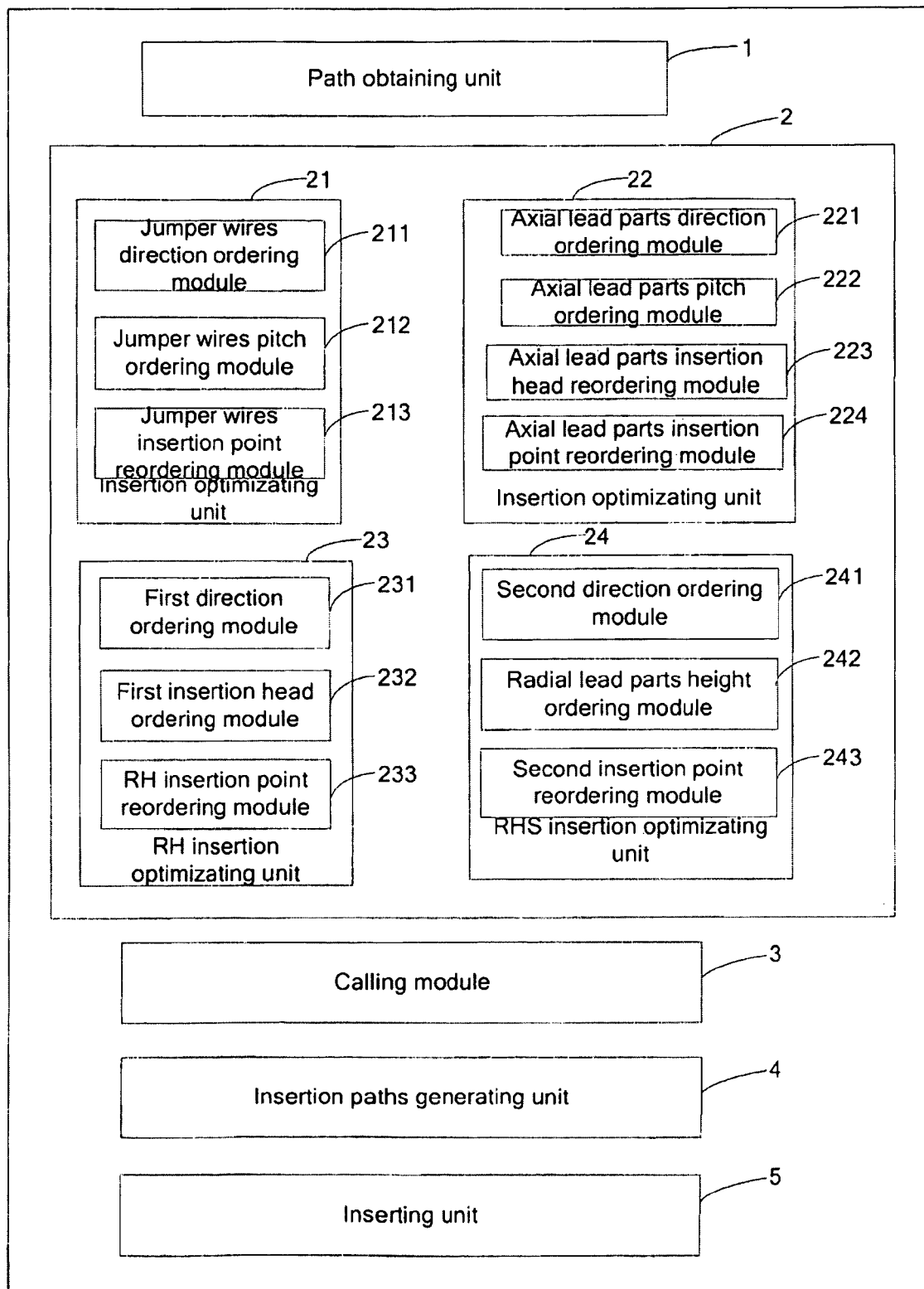
FIG. 6 is the schematic structural view of the system for insertion of components in the printed circuit board, in accordance with an embodiment of the present invention.

FIG. 6 is the schematic structural view of the inserting system for insertion of components in the printed circuit board, in accordance with an embodiment of the present invention. The inserting system can be the software unit, hardware unit or software-hardware unit built in the automatic insertion machine.

The inserting system is composed of path obtaining unit 1, an insertion parameter adjusting unit 2, a calling module 3, insertion paths generating unit 4 and inserting unit 5. Among them, the insertion parameter adjusting unit 2 consists of insertion optimizating unit 21 for jumper wires, insertion optimizating unit 22 for axial lead parts, RH insertion optimizating unit 23 for radial lead parts, and RHS insertion optimizating unit 24 for radial lead parts. Insertion optimizating unit 21 contains jumper wires direction ordering module 211, jumper wires pitch ordering module 212, and jumper wires insertion point reordering module 213. Insertion optimizating unit 22 consists of axial lead parts direction ordering module 221, axial lead parts pitch ordering module 222, axial lead parts insertion head reordering module 223, and axial lead parts insertion point reordering module 224. RH insertion optimizating unit 23 consists of first direction ordering module 231, first insertion head ordering module 232, and RH radial lead parts insertion point reordering module 233. RHS insertion optimizating unit 24 is composed of the second direction ordering module 241, radial lead parts height ordering module 242, and the second insertion point reordering module 243.

In the embodiment of the present invention, path obtaining unit 1 is used to obtain the insertion paths for insertion heads. The calling module calls the insertion parameter adjusting unit 2 to adjust the insertion parameters. Then, the insertion paths generating unit 4 generates the optimized insertion paths according to the insertion parameters adjusted. The inserting unit 5 carries out the insertion according to the optimized insertion paths.

When the automatics are jumper wires, the insertion optimizating module 21 of paths optimizating unit 2 is used to optimize the insertion paths for jumper wires. The jumper wires insertion optimizating module will use one of the following modules for optimization at least: Jumper wires direction ordering module 211, which is used to arrange in succession all the insertion points of jumper wires in the direction of 0 and 90 degrees respectively relevant to the insertion paths of jumper wires; Jumper wires pitch ordering module 212, which is used to calculate the insertion pitches of all the insertion points of jumper wires, and put all the insertion points in order according to the size of insertion pitches; jumper wires insertion point reordering module 213, which is used to reorder all the insertion points of jumper wires, so that the distance between each insertion point and its former insertion point is not more than that between latter any insertion point and its former insertion point. Furthermore, the difference of insertion pitches between the two adjacent insertion points of jumper wires increases.

When the automatic components are axial lead parts, the insertion optimizating unit 22 of paths optimizating unit 2 is used to optimize the insertion paths for axial lead parts. The insertion optimizating unit 22 for axial lead parts will use one of the following modules for optimization at least: Axial lead parts direction ordering module 221, which is used to arrange in succession all the insertion points of axial lead parts in the direction of 0, 90, 180 and 270 degrees respectively relevant to the insertion paths of axial lead parts; Axial lead parts pitch ordering module 222, which is used to calculate the insertion pitches of all the insertion points of axial lead parts, and put all the insertion points in order according to the size of insertion pitches; Axial lead parts insertion head ordering module 223, which is used to divide PCB into multiple areas, calculate the areas of all insertion points relevant to each insertion head of axial lead parts, and confirm the insertion sequence of each insertion head of axial lead parts according to the areas of insertion points relevant to the insertion head of axial lead parts as well as the area sequence for insertion of axial lead parts; Axial lead parts insertion point reordering module 224, which is used to reorder all the insertion points of axial lead parts, so that the distance between each insertion point of axial lead parts and its former insertion point is less than that between latter any insertion point and its former insertion point. Furthermore, the absolute value of the difference of insertion angles between the insertion point and its former insertion point is less than that between latter any insertion point and its former insertion point. The absolute value of the difference of insertion pitches between the insertion point and its former insertion point is less than that between latter any insertion point and its former insertion point.

When the automatic components are radial lead parts, and RH machines are used to insert the radial lead parts, RH insertion optimizating unit 23 is used to optimize the insertion paths for radial lead parts. The RH insertion optimization unit 23 for radial lead parts will use one of the following modules for optimization at least: First direction ordering module 231, which is used to arrange in succession all the insertion points of radial lead parts in the direction of 0 and 90 degrees respectively relevant to the insertion paths of radial lead parts; First insertion head ordering module 232, which is used to divide PCB into multiple areas, calculate the areas of all insertion points relevant to each insertion head of radial lead parts, and confirm the insertion sequence of each insertion head of radial lead parts according to the areas of insertion points relevant to the insertion head of axial lead parts as well as the area sequence for insertion of radial lead parts; RH insertion point reordering module 233 for radial lead parts, which is used to reorder all the insertion points of radial lead parts, so that the distance between each insertion point of radial lead parts and its former insertion point is less than that between latter any insertion point and its former insertion point. Furthermore, the absolute value of the difference of insertion angles between the insertion point and its former insertion point is less than that between latter any insertion point and its former insertion point.

When the automatic components elements are radial lead parts, and RHS machines are used to insert the radial lead parts, RHS insertion optimizating unit 24 is used to optimize the insertion paths for radial lead parts. The RHS insertion optimizating unit 24 for radial lead parts will use one of the following modules for optimization at least: Second direction ordering module 241, which is used to arrange all the insertion points in succession in the direction of 0, 90, 180 and 270 degrees respectively relevant to the insertion paths; Radial lead parts height ordering module 242, which is used to put all insertion points in order according to the height of all insertion points; Second insertion point reordering module 243, which is used to put all insertion points in order, so that the distance between each insertion point and its former insertion point is less than that between latter any insertion point and its former insertion point. And the insertion angle of the insertion point is not equal to that of any insertion point.

On the whole, in the embodiments of the present invention, the optimization program is used to adjust the insertion parameters in the original insertion programs. Then, the optimized insertion paths are generated according to the parameters adjusted, and the insertion is carried out based on the optimized insertion paths and thus improving the insertion efficiency, without a waste of manpower and the improvement of insertion efficiency is inconspicuous caused by man-made modification of insertion programs.

The above-mentioned is the preferred embodiment of the present invention, but not limited to the invention. Therefore, any modification, equivalent replacement and improvement etc on the basis of the invention shall be within the protective range of the present invention.

INDUSTRIAL APPLICABILITY

In the embodiments of the present invention, the optimization program is used to adjust the insertion parameters in the original insertion programs. Then, the optimized insertion paths are generated according to the parameters adjusted, and the insertion is carried out based on the optimized insertion paths, which, compared with existing insertion methods, is able to improve the insertion efficiency, without a waste of manpower and the improvement of insertion efficiency is inconspicuous caused by man-made modification of insertion programs.

What is claimed is:

1. An inserting method for automatic insertion of components in a printed circuit board (PCB), the method comprises:
    obtaining data regarding insertion paths stored on a data recording apparatus for insertion of the components in the PCB;
    calling optimization programs stored on a data recording apparatus to adjust insertion parameters;
    generating data regarding optimized insertion paths based on the adjusted insertion parameters;
    transmitting the data regarding the optimized insertion paths to an inserting unit and carrying out insertion based on the optimized insertion paths,
    wherein calling optimization programs stored on a data recording apparatus to adjust insertion parameters comprises:
    judging types of the components, if a component is a jumper wire, carrying out following steps:
    arranging in succession all insertion points of the jumper wires in directions of 0 degree and 90 degree respectively relevant to insertion paths of the jumper wires;
    calculating insertion pitches of all the insertion points of the jumper wires, and putting all the insertion points in order according to lengths the of the insertion pitches;
    putting all the insertion points of the jumper wires in order, so that a distance between each insertion point and its former insertion point is not greater than a distance between latter any insertion point and the former insertion point and that a difference of insertion pitches between each two adjacent insertion points of the jumper wires increases.

2. The method as claimed in claim 1, wherein obtaining data regarding insertion paths stored on a data recording apparatus for insertion of components into the PCB comprises:
    obtaining insertion program data;
    splitting the insertion program data;
    separating jumper items from insertion programs;
    deleting ineffective control items in the insertion programs;
    calculating the insertion paths for insertion of the components in the PCB according to the insertion programs of which the jumper items have been separated and the ineffective control items have been deleted.

3. The method as claimed in claim 1, further comprising confirming a start insertion point before obtaining data regarding insertion paths stored on a data recording apparatus for insertion of components into the PCB;

and integrating program data into an insertion program file after adjustment of insertion parameters, after calling optimization programs stored on a data recording apparatus to adjust insertion parameters;
wherein calling optimization programs stored on a data recording apparatus to adjust insertion parameters comprises:
calling the optimization programs to put all insertion points in order except the start insertion point.

4. The method as claimed in claim 1, wherein calling optimization programs stored on a data recording apparatus to adjust insertion parameters comprises:
judging types of the components, if a component is an axial lead part, carrying out at least one of the following steps:
arranging in succession all insertion points of the axial lead parts in directions of 0 degree, 90 degree, 180 degree and 270 degree respectively relevant to insertion paths of the axial lead parts;
calculating insertion pitches of all the insertion points of the axial lead parts, and putting all the insertion points in order according to lengths of the insertion pitches;
dividing the PCB into multiple areas, calculating an area including all insertion points relevant to an insertion head for a group of the axial lead parts, and confirming an insertion sequence of the insertion head for the group of the axial lead parts according to the area of the insertion points relevant to the insertion head for the group of the axial lead parts and according to an area sequence of all areas for insertion of the axial lead parts;
putting all the insertion points of the axial lead parts in order, so that a distance between each insertion point of the axial lead parts and its former insertion point is smaller than a distance between latter any insertion point and the former insertion point and that an absolute value of a difference of insertion angles between the insertion point and its former insertion point is smaller than an absolute value of a difference of insertion angles between latter any insertion point and the former insertion point, and that an absolute value of a difference of insertion pitches between the insertion point and the former insertion point being smaller than an absolute value of a difference between latter any insertion point and the former insertion point.

5. The method as claimed described in claim 1, wherein calling optimization programs stored on a data recording apparatus to adjust insertion parameters comprises:
arranging in succession all insertion points of radial lead parts in directions of 0 degree and 90 degree respectively relevant to insertion paths of the radial lead parts;
dividing the PCB into multiple areas, calculating an area of all insertion points relevant to an insertion head for a group of the radial lead parts, and confirming an insertion sequence of the insertion head for the group of the radial lead parts according to the area of the insertion points relevant to the insertion head for the group of the axial lead parts and according to an area sequence of all areas for insertion of the radial lead parts;
putting all the insertion points of the radial lead parts in order, so that a distance between each insertion point of the radial lead parts and its former insertion point is smaller than a distance between latter any insertion point and the former insertion point and that an absolute value of a difference of insertion angles between the insertion point and the former insertion point is smaller than a difference of insertion angles between the latter any insertion point and the former insertion point.

6. The method as claimed in claim 1, wherein calling optimization programs stored on a data recording apparatus to adjust insertion parameters comprises:
judging types of the components, if a component is a radial lead part, carrying out at least one of the following steps:
arranging in succession all insertion points of the radial lead parts in directions of 0 degree, 90 degree, 180 degree and 270 degree respectively relevant to insertion paths of the radial lead parts;
calculating insertion pitches of all the insertion points of the radial lead parts, and putting all the insertion points in order according to lengths of the insertion pitches;
putting in order all the insertion points of the radial lead parts so that a distance between each insertion point of the radial lead parts and its former insertion point is smaller than a distance between latter any insertion point and the former insertion point and that an insertion angle of the insertion point is not equal to an insertion angle of any other insertion point of the radial lead parts.

7. An inserting system for automatic insertion of components in a printed circuit board (PCB), the system comprises:
a path obtaining unit configured for obtaining data regarding insertion paths stored on a data recording apparatus for insertion of the components in the PCB;
an insertion parameter adjusting unit configured for adjusting insertion parameters;
a calling module configured for calling optimization programs stored on a data recording apparatus to adjust the insertion parameters;
an insertion path generating unit configured for generating data regarding optimized insertion paths based on the adjusted insertion parameters; and
an inserting unit configured for inserting the components based on the optimized insertion paths, the inserting unit receives data regarding the optimized insertion paths from the insertion path generating unit,
wherein the insertion parameter adjusting unit contains a jumper wire insertion optimization unit and a type of the components are jumper wires, the jumper wire insertion optimization unit is configured for adjusting insertion parameters for the jumper wires, the jumper wire insertion optimization unit comprising following modules:
a jumper wire direction ordering module configured for arranging in succession all insertion points of the jumper wires in directions of 0 degree and 90 degree respectively relevant to insertion paths of the jumper wires;
a jumper wire pitch ordering module configured for calculating insertion pitches of all the insertion points of the jumper wires, and putting in order all the insertion points of the jumper wires based on lengths of the insertion pitches;
a jumper wire insertion point reordering module configured for reordering all the insertion points of the jumper wires so that a distance between each insertion point and its former insertion point is not greater than a distance between latter any insertion point and the former insertion point and that a difference of insertion pitches between each two adjacent insertion points of the jumper wires increases.

8. The system as claimed described in claim 7, wherein
the insertion parameter adjusting unit contains an axial lead part insertion optimization unit, and a type of the components are axial lead parts, the axial lead part insertion optimization unit is configured for adjusting insertion parameters for the axial lead parts, the axial lead part insertion optimization unit comprising at least one of the following modules:

an axial lead part direction ordering module configured for arranging in succession all insertion points of the axial lead parts in directions of 0 degree, 90 degree, 180 degree and 270 degree respectively relevant to insertion paths of the axial lead parts;

an axial lead part pitch ordering module configured for calculating an insertion pitch of each of the insertion points of the axial lead parts, and putting in order all the insertion points of the axial lead parts as per lengths of the insertion pitches;

an axial lead part insertion head ordering module configured for dividing the PCB into multiple areas, calculating an area including all insertion points relevant to an insertion head for a group of the axial lead parts, and confirming an insertion sequence of the insertion head for the group of the axial lead parts according to the area of the insertion points relevant to the insertion head for the group of the axial lead parts and according to an area sequence of all areas for insertion of the axial lead parts; and an axial lead part insertion point reordering module configured for reordering all the insertion points of the axial lead parts, so that a distance between each insertion point of the axial lead parts and its former insertion point is smaller than a distance between latter any insertion point and the former insertion point, and that an absolute value of a difference of insertion angles between the insertion point and the former insertion point is smaller than an absolute value of a difference of insertion angles between latter any insertion point and the former insertion point, and that an absolute value of a difference of insertion pitches between the insertion point and the former insertion point being smaller than an absolute value of a difference between latter any insertion point and the former insertion point.

9. The system as claimed in claim 7, wherein the insertion parameter adjusting unit contains a radial lead part first insertion optimization unit and a type of the components are radial lead parts, the radial lead part first insertion optimization unit is configured for adjusting insertion parameters for the radial lead parts, the radial lead part first insertion optimization unit comprising at least one of the following modules:

a first direction ordering module configured for arranging in succession all insertion points of the radial lead parts in directions of 0 degree and 90 degree respectively relevant to insertion paths of the radial lead parts;

a first insertion head ordering module configured for dividing the PCB into multiple areas, calculating an area of all insertion points relevant to an insertion head for a group of the radial lead parts, and confirming an insertion sequence of the insertion head for the group of the radial lead parts according to the area of the insertion points relevant to the insertion head for the group of the axial lead parts an according to an area sequence of all areas for insertion of the radial lead parts; and a first insertion point reordering module configured for reordering all the insertion points of the radial lead parts, so that a distance between each insertion point of the radial lead parts and its former insertion point is smaller than a distance between latter any insertion point and the former insertion point and that an absolute value of a difference of insertion angles between the insertion point and the former insertion point is smaller than a difference of insertion angles between latter any insertion point and the former insertion point.

10. The system as claimed in claim 7, wherein the insertion parameter adjusting unit contains a radial lead part second insertion optimization unit and a type of the components are radial lead parts, the radial lead part second insertion optimization unit is configured for adjusting the insertion parameters for the radial lead parts, the radial lead part second insertion optimization unit for the radial lead parts comprising at least one of the following modules:

a second direction ordering module configured for arranging all insertion points in succession in directions of 0 degree, 90 degree, 180 degree and 270 degree respectively relevant to insertion paths of the radial lead parts; and a second insertion point reordering module configured for reordering all the insertion points so that a distance between each insertion point of the radial lead parts and its former insertion point is smaller than a distance between latter any insertion point and the former insertion point and that an insertion angle of the insertion point is not equal to an insertion angle of any other insertion point of the radial lead parts.

11. An inserting device for automatic insertion of components in a printed circuit board (PCB), the device including an inserting systems for insertion of the components in the PCB, the system comprises:

a path obtaining unit configured for obtaining data regarding insertion paths stored on a data on a data recording apparatus for insertion of the components into the PCB;

an insertion parameter adjusting unit configured for adjusting insertion parameters;

a calling module configured for calling optimization programs stored on a data recording apparatus to adjust the insertion parameters;

an insertion path generating unit configured for generating data regarding optimized insertion paths based on the adjusted insertion parameters; and an inserting unit configured for inserting the components based on the optimized insertion paths, the inserting unit receives data regarding the optimized insertion paths from the insertion path generating unit, wherein the insertion parameter adjusting unit contains a jumper wire insertion optimization unit and a type of the components are jumper wires, the jumper wire insertion optimization unit is configured for adjusting insertion parameters for the jumper wires, the jumper wire insertion optimization unit comprising following modules:

a jumper wire direction ordering module configured for arranging in succession all insertion points of the jumper wires in directions of 0 degree and 90 degree respectively relevant to insertion paths of the jumper wires;

a jumper wire pitch ordering module configured for calculating insertion pitches of all the insertion points of the jumper wires, and putting in order all the insertion points of the jumper wires based on lengths of the insertion pitches;

a jumper wire insertion point reordering module configured for reordering all the insertion points of the jumper wires so that a distance between each insertion point and its former insertion point is not greater than a distance between latter any insertion point and the former insertion point and that a difference of insertion pitches between each two adjacent insertion points of the jumper wires increases.

* * * * *